(12) United States Patent
An et al.

(10) Patent No.: US 11,521,527 B2
(45) Date of Patent: Dec. 6, 2022

(54) DISPLAY DEVICE INCLUDING WIRING FOR DETECTING CRACKS FORMED ON AREA ADJACENT TO OPENING FORMED ON DISPLAY, AND ELECTRONIC DEVICE INCLUDING SAME

(71) Applicant: SAMSUNG ELECTRONICS CO., LTD., Suwon-si (KR)

(72) Inventors: Jungchul An, Suwon-si (KR); Sangseol Lee, Suwon-si (KR); Seungheon Lee, Suwon-si (KR); Kwangtai Kim, Suwon-si (KR); Hyungsup Byeon, Suwon-si (KR); Jiwoong Oh, Suwon-si (KR)

(73) Assignee: SAMSUNG ELECTRONICS CO., LTD., Suwon-si (KR)

( * ) Notice: Subject to any disclaimer, the term of this patent is extended or adjusted under 35 U.S.C. 154(b) by 0 days.

(21) Appl. No.: 17/045,341

(22) PCT Filed: Apr. 3, 2019

(86) PCT No.: PCT/KR2019/003953
§ 371 (c)(1),
(2) Date: Oct. 5, 2020

(87) PCT Pub. No.: WO2019/194579
PCT Pub. Date: Oct. 10, 2019

(65) Prior Publication Data
US 2021/0027682 A1 Jan. 28, 2021

(30) Foreign Application Priority Data
Apr. 5, 2018 (KR) .................. 10-2018-0039805

(51) Int. Cl.
*G09G 3/00* (2006.01)
*G01R 31/54* (2020.01)
*H01L 23/528* (2006.01)

(52) U.S. Cl.
CPC ............. *G09G 3/006* (2013.01); *G01R 31/54* (2020.01); *H01L 23/528* (2013.01); *G09G 2330/12* (2013.01)

(58) Field of Classification Search
CPC ........................... G09G 3/006; G09G 2330/12
See application file for complete search history.

(56) References Cited

U.S. PATENT DOCUMENTS 10,082,689 B2 9/2018 Li et al.
10,102,785 B2 10/2018 Kim
(Continued)

FOREIGN PATENT DOCUMENTS

CN 101097389 1/2008
CN 106257571 12/2016
(Continued)

OTHER PUBLICATIONS

Notification of the First Office Action dated Jun. 23, 2021 in counterpart Chinese Application No. 201980021249.1 and English language translation.
(Continued)

*Primary Examiner* — Hang Lin
(74) *Attorney, Agent, or Firm* — Nixon & Vanderhye, P.C.

(57) ABSTRACT

A display device according to various embodiments comprises: a pixel layer comprising a plurality of pixels and having one or more parts of an area of an outer line, on which the plurality of pixels are disposed, depressively formed; and a wiring layer disposed along the depressively-formed one or more parts of the outer line, and comprising
(Continued)

detection wiring for detecting cracks on an area adjacent to the pixel layer, wherein the wiring layer can be disposed below the pixel layer. Other various embodiments are possible.

18 Claims, 15 Drawing Sheets

(56) References Cited

U.S. PATENT DOCUMENTS

| | | | |
|---|---|---|---|
| 10,267,866 B2 | 4/2019 | Lee et al. | |
| 2006/0038580 A1 | 2/2006 | Hasegawa et al. | |
| 2008/0001885 A1 | 1/2008 | Yanagisawa et al. | |
| 2010/0244705 A1 | 9/2010 | Hajjar et al. | |
| 2014/0368228 A1* | 12/2014 | Kim | G09G 3/006 |
| | | | 324/750.3 |
| 2016/0179229 A1* | 6/2016 | Ahn | H01L 27/3262 |
| | | | 345/173 |
| 2016/0247436 A1 | 8/2016 | Lee et al. | |
| 2016/0372017 A1 | 12/2016 | Byun et al. | |
| 2017/0069239 A1 | 3/2017 | Kwon et al. | |
| 2018/0033354 A1 | 2/2018 | Lee et al. | |
| 2018/0053466 A1 | 2/2018 | Zhang et al. | |
| 2018/0053792 A1 | 2/2018 | Shin et al. | |
| 2018/0158741 A1* | 6/2018 | Kim | G09G 3/006 |
| 2019/0043452 A1 | 2/2019 | Silvanto et al. | |

FOREIGN PATENT DOCUMENTS

| | | |
|---|---|---|
| CN | 107680481 | 2/2018 |
| JP | 2010-231191 | 10/2010 |
| JP | 2014-021479 | 2/2014 |
| JP | 2014-145849 | 8/2014 |
| KR | 10-2014-0145444 | 12/2014 |
| KR | 10-2016-0019954 | 2/2016 |
| KR | 10-2017-0080764 | 7/2017 |
| KR | 10-2018-0021965 | 3/2018 |
| WO | 2017/058416 | 4/2017 |

OTHER PUBLICATIONS

International Search Report for PCT/KR2019/003953 dated Jul. 25, 2019, 5 pages.
Written Opinion of the ISA for PCT/KR2019/003953 dated Jul. 25, 2019, 8 pages.
Extended Search Report dated Mar. 29, 2021 in counterpart European Application No. 19781665.5.
Office Action dated Aug. 1, 2022 in counterpart Korean Application No. 10-2018-0039805 and English language translation.

* cited by examiner

| Input | | output | |
|---|---|---|---|
| Detection Line 1 | Detection Line 2 | | |
| High | High | Low | Outline, Inside Detection/ Notch Shield |
| High | Low | High | Inside, Notch Detection |
| Low | High | | Outline, Notch Detection |
| Low | Low | | Notch Detection |

| Input | | output | |
|---|---|---|---|
| Detection Line 1 | Detection Line 2 | | |
| High | High | High | All Detection |
| High | Low | | Inside, Notch Detection |
| Low | High | | Outline, Notch Detection |
| Low | Low | Low | All Shield |

DISPLAY DEVICE INCLUDING WIRING FOR DETECTING CRACKS FORMED ON AREA ADJACENT TO OPENING FORMED ON DISPLAY, AND ELECTRONIC DEVICE INCLUDING SAME

This application is the U.S. national phase of International Application No. PCT/KR2019/003953 filed Apr. 3, 2019 which designated the U.S. and claims priority to KR Patent Application No. 10-2018-0039805 filed Apr. 5, 2018, the entire contents of each of which are hereby incorporated by reference.

FIELD

The disclosure relates to a display device and an electronic device with a display and, more particularly, to a circuit and a mechanism structure capable of detecting cracks formed on an area adjacent to an opening formed in a display.

DESCRIPTION OF RELATED ART

With the development of mobile communication and processor technologies, portable terminal devices (e.g., electronic devices) can be made to implement various functions in addition to a typical communication function. Accordingly, each of the electronic devices is provided with a display in order to visually provide various functions to a user.

Users require an electric device having a larger display, and the electric device is inevitably limited to a size due to portability. In this way, the electric device having a limited size needs to provide a display as large as possible. Further, receivers or the like for communicating with various sensors, in addition to a display as well as a camera should be disposed in a front surface of the electronic device.

SUMMARY

As a method of increasing the size of the display in the electronic device having a limited size, there is a method of physically cutting a partial area out of the display so as to be depressively formed in a shape other than a rectangular shape, and disposing components of the electronic device such as a camera in the formed area (or opening). A dead space is reduced on a front surface of the electronic device having a notched display, but there is a possibility of the cut area cracking.

Various embodiments of the disclosure are directed to providing a display device and an electronic device capable of detecting cracks of a notched display as described above.

A display device according to various embodiments includes: a pixel layer configured to include a plurality of pixels and have at least a partial area of an outline on which the plurality of pixels are disposed, the at least partial area of the outline being depressively formed; and a wiring layer disposed along the depressively-formed at least partial area of the outline, and configured to include detection wiring for detecting cracks on an area adjacent to the pixel layer. The wiring layer is disposed below the pixel layer.

An electronic device according to various embodiments includes: a display configure to include a pixel layer having at least a partial area of an outline on which a plurality of pixels are disposed, and a wiring layer on which a detection wiring for detecting cracks on an area adjacent to the pixel layer is formed, the at least partial area of the outline being depressively formed; and at least one sensor disposed on the depressively-formed at least partial area. The detection wiring is disposed along the depressively-formed at least partial area of the outline between the outline and the at least one sensor.

A device for detecting cracks of at least a part of a display device according to various embodiments includes: an output circuit for outputting a first electrical signal to a first stage of detection wiring of the display device; an input circuit for receiving a second electrical signal input from a second stage of the detection wiring; and a processor that is operatively connected to the output circuit and the input circuit. The processor is set to output the first electrical signal to the detection wiring using the output circuit, to receive the second electrical signal using the input circuit, and to detect the cracks on an area adjacent to a pixel layer of the display device on the basis of the first electrical signal and the second electrical signal.

According to various embodiments of the disclosure, a display device and an electronic device having mechanical and/or electrical components that can detect cracks of an opened display and can minimize noise between the display and components mounted on the opened portion can be provided.

DETAILED DESCRIPTION OF EXAMPLE EMBODIMENTS

Figure 1:
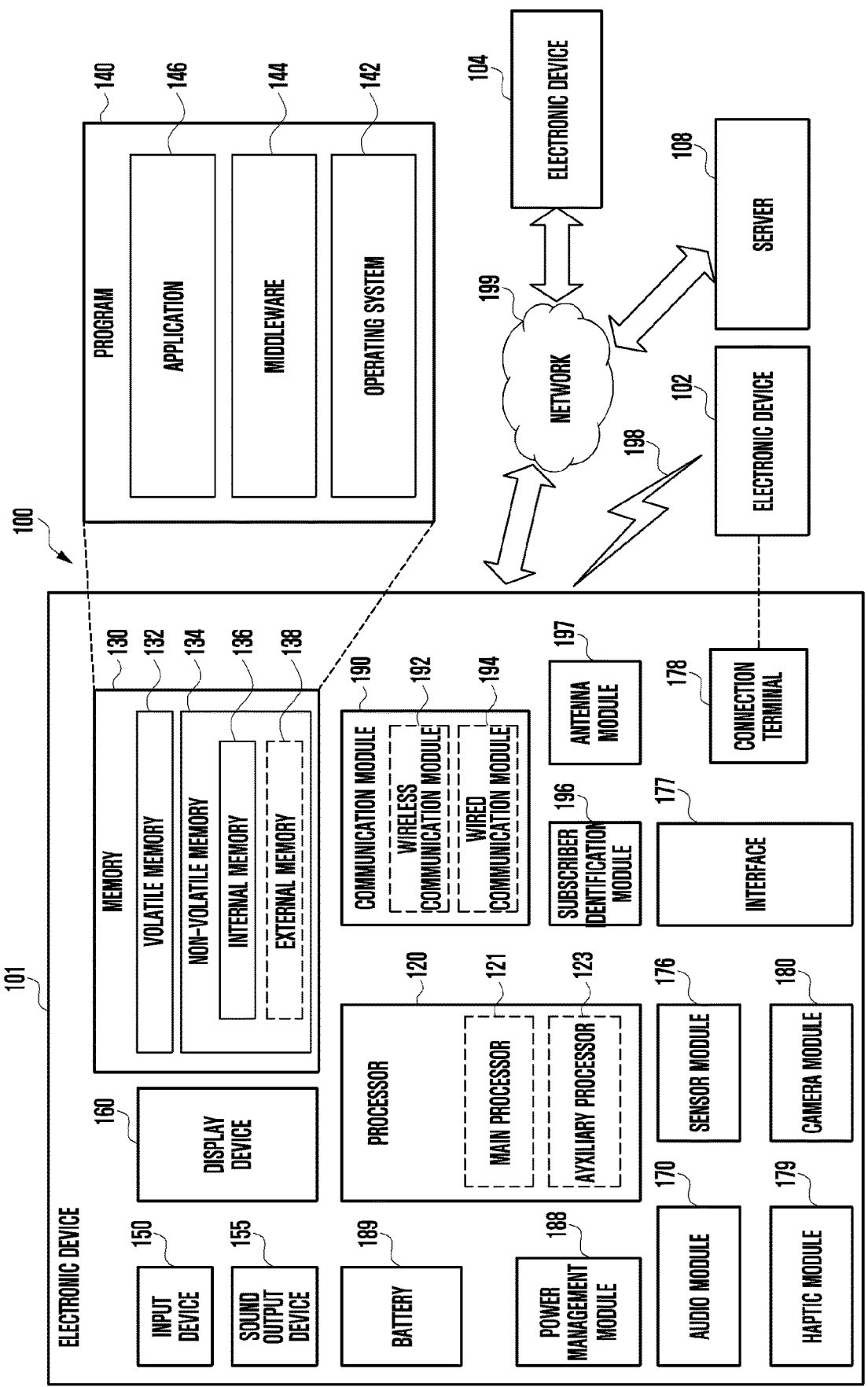
FIG. 1 is a block diagram illustrating an electronic device in a network environment according to various embodiments.

FIG. 1 is a block diagram illustrating an electronic device 101 in a network environment 100 according to various embodiments. Referring to FIG. 1, the electronic device 101 in the network environment 100 may communicate with an electronic device 102 via a first network 198 (e.g., a short-range wireless communication network), or an electronic device 104 or a server 108 via a second network 199 (e.g., a long-range wireless communication network). According to an embodiment, the electronic device 101 may communicate with the electronic device 104 via the server 108. According to an embodiment, the electronic device 101 may include a processor 120, memory 130, an input device 150, a sound output device 155, a display device 160, an audio module 170, a sensor module 176, an interface 177, a haptic module 179, a camera module 180, a power management module 188, a battery 189, a communication module 190, a subscriber identification module (SIM) 196, or an antenna module 197. In some embodiments, at least one (e.g., the display device 160 or the camera module 180) of the components may be omitted from the electronic device 101, or one or more other components may be added in the electronic device 101. In some embodiments, some of the components may be implemented as single integrated circuitry. For example, the sensor module 176 (e.g., a fingerprint sensor, an iris sensor, or an illuminance sensor) may be implemented as embedded in the display device 160 (e.g., a display).

The processor 120 may execute, for example, software (e.g., a program 140) to control at least one other component (e.g., a hardware or software component) of the electronic device 101 coupled with the processor 120, and may perform various data processing or computation. According to one embodiment, as at least part of the data processing or computation, the processor 120 may load a command or data received from another component (e.g., the sensor module 176 or the communication module 190) in volatile memory 132, process the command or the data stored in the volatile memory 132, and store resulting data in non-volatile memory 134. According to an embodiment, the processor 120 may include a main processor 121 (e.g., a central processing unit (CPU) or an application processor (AP)), and an auxiliary processor 123 (e.g., a graphics processing unit (GPU), an image signal processor (ISP), a sensor hub processor, or a communication processor (CP)) that is operable independently from, or in conjunction with, the main processor 121. Additionally or alternatively, the auxiliary processor 123 may be adapted to consume less power than the main processor 121, or to be specific to a specified function. The auxiliary processor 123 may be implemented as separate from, or as part of the main processor 121.

The auxiliary processor 123 may control at least some of functions or states related to at least one component (e.g., the display device 160, the sensor module 176, or the communication module 190) among the components of the electronic device 101, instead of the main processor 121 while the main processor 121 is in an inactive (e.g., sleep) state, or together with the main processor 121 while the main processor 121 is in an active state (e.g., executing an application). According to an embodiment, the auxiliary processor 123 (e.g., an image signal processor or a communication processor) may be implemented as part of another component (e.g., the camera module 180 or the communication module 190) functionally related to the auxiliary processor 123.

The memory 130 may store various data used by at least one component (e.g., the processor 120 or the sensor module 176) of the electronic device 101. The various data may include, for example, software (e.g., the program 140) and input data or output data for a command related thererto. The memory 130 may include the volatile memory 132 or the non-volatile memory 134.

The program 140 may be stored in the memory 130 as software, and may include, for example, an operating system (OS) 142, middleware 144, or an application 146.

The input device 150 may receive a command or data to be used by other component (e.g., the processor 120) of the electronic device 101, from the outside (e.g., a user) of the electronic device 101. The input device 150 may include, for example, a microphone, a mouse, or a keyboard.

The sound output device 155 may output sound signals to the outside of the electronic device 101. The sound output device 155 may include, for example, a speaker or a receiver. The speaker may be used for general purposes, such as playing multimedia or playing record, and the receiver may be used for an incoming calls. According to an embodiment, the receiver may be implemented as separate from, or as part of the speaker.

The display device 160 may visually provide information to the outside (e.g., a user) of the electronic device 101. The display device 160 may include, for example, a display, a hologram device, or a projector and control circuitry to control a corresponding one of the display, hologram device, and projector. According to an embodiment, the display device 160 may include touch circuitry adapted to detect a touch, or sensor circuitry (e.g., a pressure sensor) adapted to measure the intensity of force incurred by the touch.

The audio module 170 may convert a sound into an electrical signal and vice versa. According to an embodiment, the audio module 170 may obtain the sound via the input device 150, or output the sound via the sound output device 155 or a headphone of an external electronic device (e.g., an electronic device 102) directly (e.g., wiredly) or wirelessly coupled with the electronic device 101.

The sensor module 176 may detect an operational state (e.g., power or temperature) of the electronic device 101 or an environmental state (e.g., a state of a user) external to the electronic device 101, and then generate an electrical signal or data value corresponding to the detected state. According to an embodiment, the sensor module 176 may include, for example, a gesture sensor, a gyro sensor, an atmospheric pressure sensor, a magnetic sensor, an acceleration sensor, a grip sensor, a proximity sensor, a color sensor, an infrared (IR) sensor, a biometric sensor, a temperature sensor, a humidity sensor, or an illuminance sensor.

The interface 177 may support one or more specified protocols to be used for the electronic device 101 to be coupled with the external electronic device (e.g., the electronic device 102) directly (e.g., wiredly) or wirelessly. According to an embodiment, the interface 177 may include, for example, a high definition multimedia interface (HDMI), a universal serial bus (USB) interface, a secure digital (SD) card interface, or an audio interface.

A connecting terminal 178 may include a connector via which the electronic device 101 may be physically connected with the external electronic device (e.g., the electronic device 102). According to an embodiment, the connecting terminal 178 may include, for example, a HDMI connector, a USB connector, a SD card connector, or an audio connector (e.g., a headphone connector), The haptic module 179 may convert an electrical signal into a mechanical stimulus (e.g., a vibration or a movement) or electrical stimulus which may be recognized by a user via his tactile sensation or kinesthetic sensation. According to an embodiment, the haptic module 179 may include, for example, a motor, a piezoelectric element, or an electric stimulator.

The camera module 180 may capture a still image or moving images. According to an embodiment, the camera module 180 may include one or more lenses, image sensors, image signal processors, or flashes.

The power management module 188 may manage power supplied to the electronic device 101. According to one embodiment, the power management module 188 may be implemented as at least part of, for example, a power management integrated circuit (PMIC).

The battery 189 may supply power to at least one component of the electronic device 101. According to an embodiment, the battery 189 may include, for example, a primary cell which is not rechargeable, a secondary cell which is rechargeable, or a fuel cell.

The communication module 190 may support establishing a direct (e.g., wired) communication channel or a wireless communication channel between the electronic device 101 and the external electronic device (e.g., the electronic device 102, the electronic device 104, or the server 108) and performing communication via the established communication channel. The communication module 190 may include one or more communication processors that are operable independently from the processor 120 (e.g., the application processor (AP)) and supports a direct (e.g., wired) communication or a wireless communication. According to an embodiment, the communication module 190 may include a wireless communication module 192 (e.g., a cellular communication module, a short-range wireless communication module, or a global navigation satellite system (GNSS) communication module) or a wired communication module 194 (e.g., a local area network (LAN) communication module or a power line communication (PLC) module). A corresponding one of these communication modules may communicate with the external electronic device via the first network 198 (e.g., a short-range communication network, such as Bluetooth™, wireless-fidelity (Wi-Fi) direct, or infrared data association (IrDA)) or the second network 199 (e.g., a long-range communication network, such as a cellular network, the Internet, or a computer network (e.g., LAN or wide area network (WAN)). These various types of communication modules may be implemented as a single component (e.g., a single chip), or may be implemented as multi components (e.g., multi chips) separate from each other. The wireless communication module 192 may identify and authenticate the electronic device 101 in a communication network, such as the first network 198 or the second network 199, using subscriber information (e.g., international mobile subscriber identity (IMSI)) stored in the subscriber identification module 196.

The antenna module 197 may transmit or receive a signal or power to or from the outside (e.g., the external electronic device) of the electronic device 101. According to an embodiment, the antenna module 197 may include one or more antennas, and, therefrom, at least one antenna appropriate for a communication scheme used in the communication network, such as the first network 198 or the second network 199, may be selected, for example, by the communication module 190 (e.g., the wireless communication module 192). The signal or the power may then be transmitted or received between the communication module 190 and the external electronic device via the selected at least one antenna.

At least some of the above-described components may be coupled mutually and communicate signals (e.g., commands or data) therebetween via an inter-peripheral communication scheme (e.g., a bus, general purpose input and output (GPIO), serial peripheral interface (SPI), or mobile industry processor interface (MIPI)).

According to an embodiment, commands or data may be transmitted or received between the electronic device 101 and the external electronic device 104 via the server 108 coupled with the second network 199. Each of the electronic devices 102 and 104 may be a device of a same type as, or a different type, from the electronic device 101. According to an embodiment, all or some of operations to be executed at the electronic device 101 may be executed at one or more of the external electronic devices 102, 104, or 108. For example, if the electronic device 101 should perform a function or a service automatically, or in response to a request from a user or another device, the electronic device 101, instead of, or in addition to, executing the function or the service, may request the one or more external electronic devices to perform at least part of the function or the service. The one or more external electronic devices receiving the request may perform the at least part of the function or the service requested, or an additional function or an additional service related to the request, and transfer an outcome of the performing to the electronic device 101. The electronic device 101 may provide the outcome, with or without further processing of the outcome, as at least part of a reply to the request. To that end, a cloud computing, distributed computing, or client-server computing technology may be used, for example.

The electronic device according to various embodiments may be one of various types of electronic devices. The electronic devices may include, for example, a portable communication device (e.g., a smart phone), a computer device, a portable multimedia device, a portable medical device, a camera, a wearable device, or a home appliance. According to an embodiment of the disclosure, the electronic devices are not limited to those described above.

It should be appreciated that various embodiments of the disclosure and the terms used therein are not intended to limit the technological features set forth herein to particular embodiments and include various changes, equivalents, or replacements for a corresponding embodiment. With regard to the description of the drawings, similar reference numerals may be used to refer to similar or related elements. It is to be understood that a singular form of a noun corresponding to an item may include one or more of the things, unless the relevant context clearly indicates otherwise. As used herein, each of such phrases as "A or B," "at least one of A and B," "at least one of A or B," "A, B, or C," "at least one of A, B, and C," and "at least one of A, B, or C," may include all possible combinations of the items enumerated together in a corresponding one of the phrases. As used herein, such terms as "1st" and "2nd," or "first" and "second" may be used to simply distinguish a corresponding component from another, and does not limit the components in other aspect (e.g., importance or order). It is to be understood that if an element (e.g., a first element) is referred to, with or without the term "operatively" or "communicatively", as "coupled with," "coupled to," "connected with," or "connected to" another element (e.g., a second element), it means that the element may be coupled with the other element directly (e.g., wiredly), wirelessly, or via a third element.

As used herein, the term "module" may include a unit implemented in hardware, software, or firmware, and may interchangeably be used with other terms, for example, "logic," "logic block," "part," or "circuitry". A module may be a single integral component, or a minimum unit or part thereof, adapted to perform one or more functions. For example, according to an embodiment, the module may be implemented in a form of an application-specific integrated circuit (ASIC).

Various embodiments as set forth herein may be implemented as software (e.g., the program 140) including one or more instructions that are stored in a storage medium (e.g., internal memory 136 or external memory 138) that is readable by a machine (e.g., the electronic device 101). For example, a processor (e.g., the processor 120) of the machine (e.g., the electronic device 101) may invoke at least one of the one or more instructions stored in the storage medium, and execute it, with or without using one or more other components under the control of the processor. This allows the machine to be operated to perform at least one function according to the at least one instruction invoked. The one or more instructions may include a code generated by a complier or a code executable by an interpreter. The machine-readable storage medium may be provided in the form of a non-transitory storage medium. Wherein, the term "non-transitory" simply means that the storage medium is a tangible device, and does not include a signal (e.g., an electromagnetic wave), but this term does not differentiate between where data is semi-permanently stored in the storage medium and where the data is temporarily stored in the storage medium.

According to an embodiment, a method according to various embodiments of the disclosure may be included and provided in a computer program product. The computer program product may be traded as a product between a seller and a buyer. The computer program product may be distributed in the form of a machine-readable storage medium (e.g., compact disc read only memory (CD-ROM)), or be distributed (e.g., downloaded or uploaded) online via an application store (e.g., Play Store™), or between two user devices (e.g., smart phones) directly. If distributed online, at least part of the computer program product may be temporarily generated or at least temporarily stored in the machine-readable storage medium, such as memory of the manufacturer's server, a server of the application store, or a relay server.

According to various embodiments, each component (e.g., a module or a program) of the above-described components may include a single entity or multiple entities. According to various embodiments, one or more of the above-described components may be omitted, or one or more other components may be added. Alternatively or additionally, a plurality of components (e.g., modules or programs) may be integrated into a single component. In such a case, according to various embodiments, the integrated component may still perform one or more functions of each of the plurality of components in the same or similar manner as they are performed by a corresponding one of the plurality of components before the integration. According to various embodiments, operations performed by the module, the program, or another component may be carried out sequentially, in parallel, repeatedly, or heuristically, or one or more of the operations may be executed in a different order or omitted, or one or more other operations may be added.

Figure 2A:
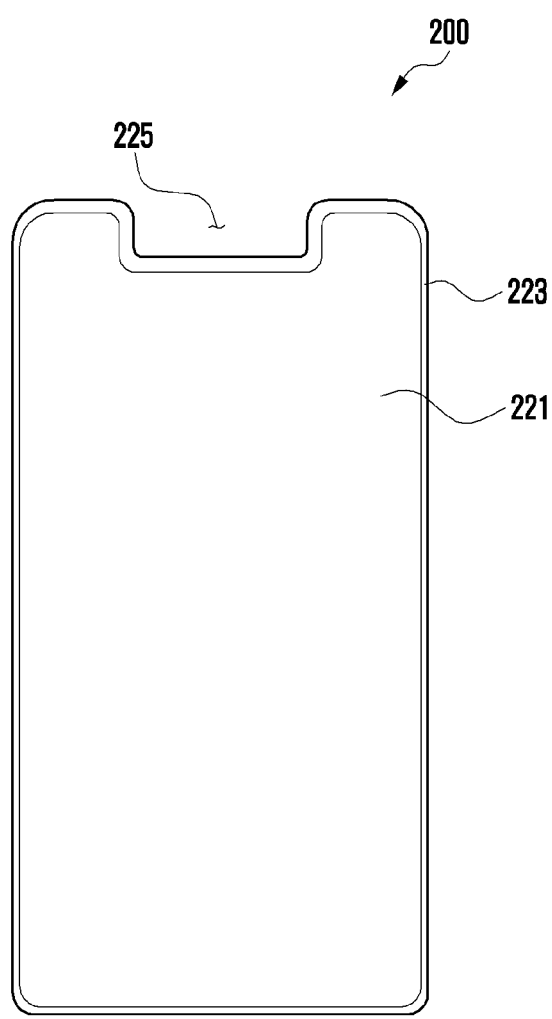
FIGS. 2A and 2B briefly illustrate a display with an opening according to various embodiments.

FIG. 2A briefly illustrates a display with an opening according to various embodiments.

According to various embodiments, a display 200 (e.g., the display device 160 of FIG. 1) includes a display area 221 in a front surface thereof. The display area 221 may include a pixel layer made up of a plurality of pixels by which image data is displayed. The display 200 according to various embodiments may include a non-display area 223. The non-display area 223 may include wiring that connects a display driving circuit (not illustrated) and the plurality of pixels of the display area 221. A wiring layer and/or a polymer layer may be disposed below the pixel layer. For example, the polymer layer may include any one or a combination of two or more selected from among polycarbonate (PC), polymethyl methacrylate (PMMA), polyimide (PI), polyethylene terephthalate (PET), polypropylene terephthalate (PPT), amorphous polyethylene terephthalate (APET), polyethylene naphthalate terephthalate (PEN), polyethylene terephthalate glycol (PETG), tri-acetyl-cellulose (TAC), a cyclic olefin polymer (COP), a cyclic olefin copolymer (COC), dicyclopentadiene (DCPD), cyclopentadiene (CPD), polyarylate (PAR), polyethersulfone (PES), polyetherimide (PEI), a modified epoxy resin, or an acrylic resin.

As illustrated, a partial area 225 may be depressively formed in the display 200. In other words, the display 200 may be configured such that a partial area is cut from the display 200 having a typical rectangular shape and no pixel layer is disposed on an area depressed inward. As described above, the depressed area of the display 200 herein may be called opening area. Hereinafter, for convenience of description, the opening area 225 according to various embodiments may refer to at least a partial area of the display 200 which is adjacent to the opening area 225. For example, the opening area 225 may include a portion (e.g., partial areas of the display area 221 and the non-display area 223) adjacent to the depressed area where the pixels for displaying information in the display 200 are not disposed. It is illustrated in FIG. 2 that the opening area 225 is formed in a middle area of an upper end of the display 200. However, a position, size, and/or shape of the opening area 225 are not limited to those of FIG. 2.

As illustrated, the opening area 225 (e.g., an area including the portion adjacent to the opening area 225 in the display 200) inevitably suffers from a high risk of cracks when receiving a physical impact according to a shape thereof. Especially, cracks may occur at a portion of the pixel layer of the display 200 according to a physical impact in a process of assembling the display 200 with other constituent parts to manufacture an electronic device (e.g., the electronic device 101 of FIG. 1).

According to various embodiments, the display 200 may include physical and/or electrical components for detecting the cracks of the pixel layer which may occur at the opening area 225. Further, in the case where the display 200 is assembled into an electronic device along with other constituent parts, the crack risk of the pixel layer is reduced, and thus the physical and/or electrical components may be used to minimize noise with components such as a camera and a sensor disposed adjacent thereto.

Figure 2B:
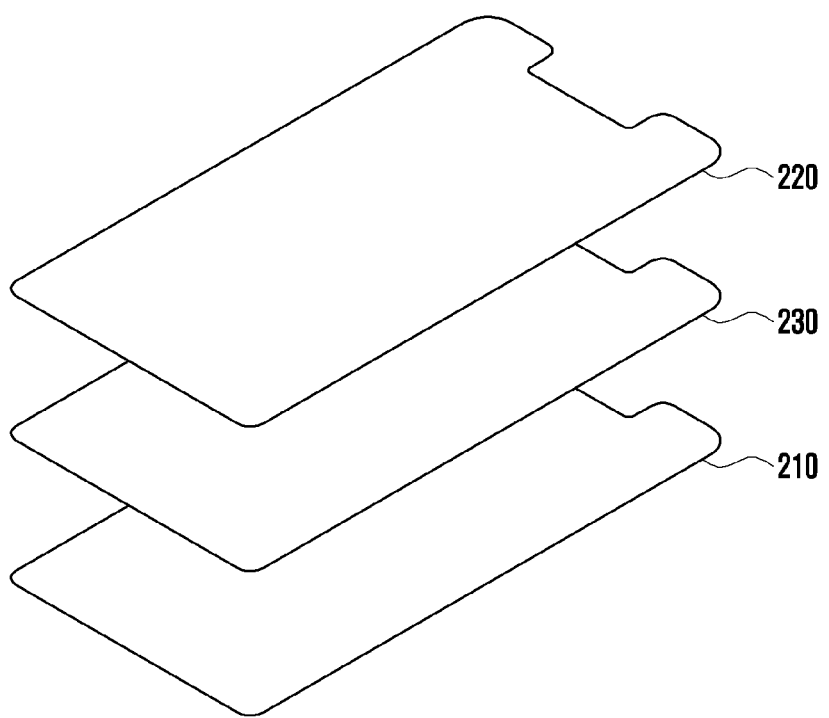

FIG. 2B illustrates a layered structure of the display 200 according to various embodiments.

According to various embodiments, the display may include a pixel layer 220, a wiring layer 230, and a polymer layer 210. As illustrated in FIG. 2B, the pixel layer 220, the wiring layer 230, and the polymer layer 210 may be layered in order.

According to various embodiments, at least a part (e.g., detection wiring) of the wiring layer 230 may be disposed to be parallel to the pixel layer 220 above the polymer layer 210 rather than below the pixel layer 220.

Figure 3:
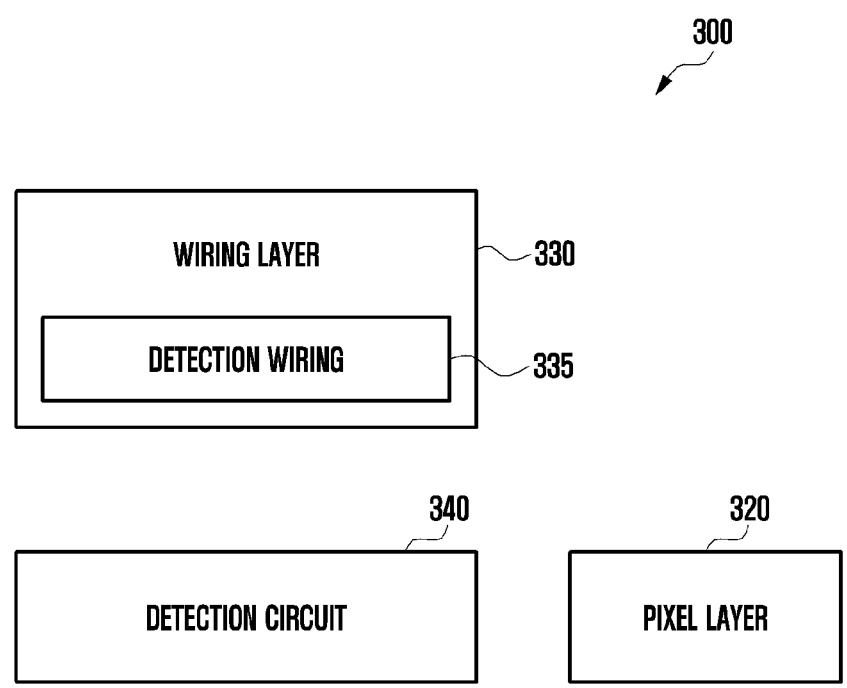
FIG. 3 is a block diagram illustrating a display device according to various embodiments.

FIG. 3 is a block diagram illustrating a display device according to various embodiments.

As illustrated, a display device 300 (e.g., the display device 160 or the display 220) may include a pixel layer 320, a wiring layer 330, and a detection circuit 340.

According to various embodiments, the display device 300 may be made up of at least one of a liquid crystal display (LCD), a light emitting diode (LED) display, an organic light-emitting diode (OLED) display, a microelectromechanical system (MEMS) display, or an electronic paper display. A touch screen may be disposed on the back of the display or integrally with the display. The display device 300 may include at least some of the components and/or functions of the display device 160 of FIG. 1.

The pixel layer 320 may include a plurality of pixels. As illustrated in FIG. 2, at least a partial area of an outline on which the plurality of pixels of the pixel layer 320 are disposed may be depressively formed (e.g., the opening area 225 of FIG. 2).

According to various embodiments, the wiring layer 330 may include detection wiring 335 for detecting cracks of the pixel layer 320. The detection wiring 335 may be disposed along the depressively-formed at least partial area (e.g., the opening area) of the outline of the pixel layer 320, and be damaged by cracks formed on an area adjacent thereto. According to various embodiments, the processor of the electronic device (e.g., the processor 120 of the electronic device 101 of FIG. 1), the detection circuit 340, or an external electronic device (e.g., the electronic device 102 of FIG. 1) may determine that cracks are formed around the detection wiring 335 at least on the basis of damage to the detection wiring 335. For example, the detection circuit 340 may include a lighting circuit for detecting whether cracks are formed by emitting light from at least a part of the pixel layer 320, or a display driver IC (DDI). According to various embodiments, the detection wiring 335 may be disposed on an edge of the entire area of the pixel layer 320 as a whole, or be disposed only on an edge of the area adjacent to the opening area.

According to various embodiments, a wiring layer 330 and a polymer layer (e.g., the polymer layer 250 of FIG. 2B) (e.g., polyethylene terephthalate (PET) or polyimide (PI) may be disposed below the pixel layer 320. For example, at least a part of the wiring layer 330 may extend on the polymer layer to be parallel to the pixel layer 320.

According to various embodiments, the detection wiring 335 may be configured such that at least a part thereof is damaged by cracks formed on an opening-adjacent area. To this end, the detection wiring 335 may include at least one wiring, and be disposed adjacent to the opening area. For example, in the case where cracks are formed on at least a part of the wiring layer 330, the pixel layer 320, or the polymer layer which is adjacent to the opening, the detection wiring 335 may also be damaged so that impedance (or resistance) of the detection wiring 335 may be changed, and magnitudes of electrical signals (e.g., a current and a voltage) which an electronic device (e.g., the electronic device 100 including the display 300) or an external electronic device (e.g., a crack inspection device in a process) obtain through the detection wiring 335 may be changed.

According to various embodiments, the display device 300 may include a detection circuit 340 (e.g., a lighting circuit) that is connected to the electronic device (e.g., the electronic device 101) and the detection wiring 335 and is configured to perform lighting according to an electrical signal input from the detection wiring 335. The detection circuit 340 may be connected to the detection wiring 335 and the pixel layer 320, and output a signal such that, if cracks are detected from at least a part of the pixel layer 320 (e.g., if damage to the detection wiring 335 is detected) in a process of performing a crack detecting function, at least some pixels of the connected pixel layer 320 emit light. According to various embodiments, the detection circuit 340 may include a light emitting member (e.g., a light emitting diode (LED)), and control the light emitting member to emit light if cracks are detected. According to various embodiments, the detection circuit 340 may be disposed on the opening area, or the depressively-formed at least partial area of the outline of the pixel layer 320, and be disposed, for example, on the back of an area on which a receiver is disposed in the electronic device.

In a method of configuring the detection wiring 335, various embodiments are possible.

According to various embodiments, the detection wiring 335 may include a first detection line and a second detection line. As described above, the detection wiring 335 may be disposed on the polymer layer and adjacent to a side of the pixel layer 320. The first detection line may be disposed more adjacent to the pixel layer 320 than the second detection line. Specific configuration of the first detection line and the second detection line will be described in more detail with reference to FIG. 6.

The detection wiring 335 may include a logic circuit that is connected to the first detection line and the second detection line and is configured to output an electrical signal corresponding to whether or not cracks are formed on the pixel layer 320 on the basis of the electrical signals input from the first detection line and the second detection line. For example, the logic circuit may be made up of a NAND gate or an OR gate. According to an output value of the logic circuit, it may be checked whether or not cracks are formed on the pixel layer 320. Specific examples of the logic circuit will be described in more detail with reference to FIGS. 7A and 7B.

According to various embodiments, the detection wiring 335 may further include at least one dot pattern line that is disposed between the first detection line and the second detection line and is connected to at least one of the first detection line and the second detection line. At least one dot pattern line is for more accurately detecting formation of the cracks on the opening-adjacent area, and may be disposed on corner areas having a high possibility of the cracks being formed on the opening-adjacent area. A configuration of the dot pattern line will be described in more detail with reference to FIG. 8.

According to various embodiments, the detection wiring 335 may further include a curve pattern line that is disposed between the first detection line and the second detection line and is connected to at least one of the first detection line and the second detection line. Because the curve pattern line may be formed in an "S" shape and cover a wide area between the first detection line and the second detection line, more accurate crack detection is possible. A specific configuration of the curve pattern line will be described in more detail with reference to FIG. 9.

According to various embodiments, the detection wiring 335 may be connected to a crack detection terminal to which an external device can be connected. The crack detection terminal according to various embodiments is for connecting the external device for detecting cracks of the display in a process of manufacturing the display device 300 or a process of assembling the display device 300 to the electronic device. That is, in the case where the external device is connected to the crack detection terminal, an electrical signal is input from the external device, and it is detected whether or not the detection wiring 335 is abnormal. It may be determined at least on the basis of the detection whether or not the pixel layer 320 is abnormal. In another embodiment, the crack detection terminal may be connected to a processor (e.g., the processor 120) of the electronic device (e.g., the electronic device 100) including the display device 300. The processor 120 may determine whether or not the pixel layer 320 is abnormal at least partly on the basis of the detection whether or not the detection wiring 335 is abnormal.

According to various embodiments, the wiring layer may include a switch that connects the detection wiring 335 to the detection circuit 340 when the crack detecting function of the pixel layer 320 is performed, and that connects the detection wiring 335 to a ground if the crack detecting function of the pixel layer 320 is completed. For example, in the case where the external device is connected to the crack detection terminal and the crack detecting function is performed, the switch may perform switching such that the detection wiring 335 is connected to the detection circuit 340. In the case where the cracks are formed on the pixel layer 320, the detection circuit 340 is made to light at least some pixels of the pixel layer 320 according to a signal output from the detection wiring 335, and thus it may be visually checked whether or not the cracks are formed on the pixel layer 320. Further, in the case where the crack detecting function is completed, the switch may connect the detection wiring 335 to the ground. The crack detecting function may be performed in the process of manufacturing the display device 300 and/or the process of assembling the display device 300 to the electronic device. In the case where a user actually uses the completed electronic device, the crack detecting function may not be carried out. In this case, to reduce noise between the display and the components such as a camera, a sensor, etc. disposed on the opening area, the detection wiring 335 is connected to the ground, which leads to a shielding effect. A specific configuration of the switch will be described in more detail with reference to FIG. 10.

Figure 4:
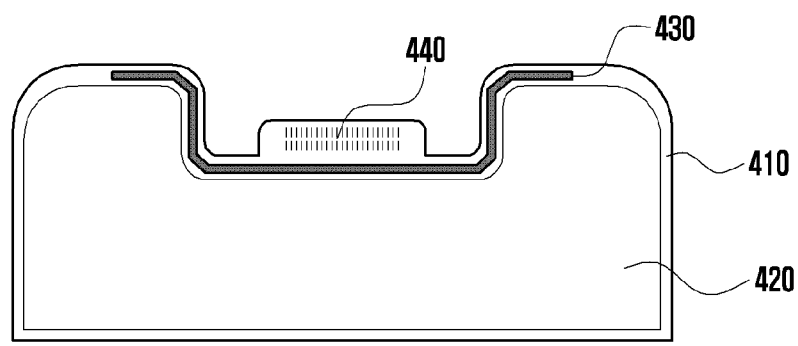
FIGS. 4 and 5 illustrate a layout form of detection wiring according to various embodiments.
Figure 5:
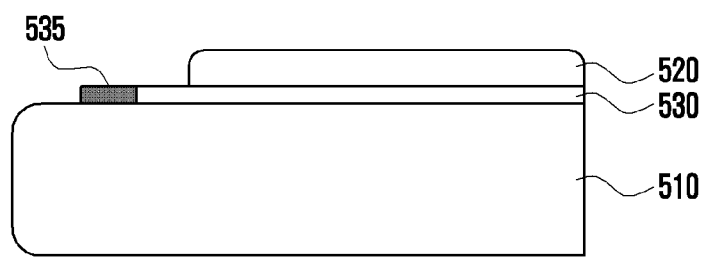

FIGS. 4 and 5 illustrate a layout form of detection wiring according to various embodiments.

FIG. 4 is a front view illustrating the display device.

According to various embodiments, the display device may include a pixel layer 420 and a polymer layer 410. The polymer layer 410 may be disposed below the pixel layer 420.

A wiring layer (e.g., the wiring layer 330 of FIG. 3) may include detection wiring 430 for detecting cracks of the pixel layer 420 and/or the polymer layer 410. As illustrated in FIG. 4, the detection wiring 430 may be disposed along at least a partial area (e.g., an opening-adjacent area) of an outline of the pixel layer 420 in which the at least partial area is depressively formed, and detect cracks formed on the opening-adjacent area. According to an embodiment, the detection wiring 430 may be disposed over the entire area of the display device, and detect cracks formed on the entire area of the pixel layer 420 and/or the polymer layer 410.

The detection circuit 440 may be connected to the detection wiring 430, and be disposed on the back of the depressively-formed at least partial area of the outline of the pixel layer 420, for example, an area on which a receiver is formed in the electronic device.

FIG. 5 is a side view illustrating the display device.

According to various embodiments, a polymer layer 510 may be configured such that polyethylene terephthalate (PET) and polyimide (PI) are layered. A wiring layer 530 and a pixel layer 520 may be disposed on the polymer layer 510. The wiring layer 530 may include detection wiring 535. At least a part (e.g., the detection wiring 535) of the wiring layer 530 may be disposed at a position parallel to the pixel layer 520 on the polymer layer 510.

The detection wiring 535 and the pixel layer 520 may be disposed adjacent to each other. However, as described above, the detection wiring 535 is connected to the ground in the state in which the crack detecting function is not activated, and thus the detection wiring 535 and the pixel layer 520 may not be mutually subjected to an electrical influence.

Figure 6A:
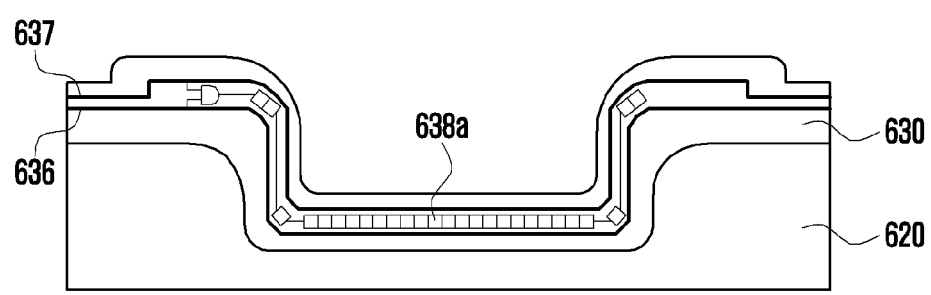
FIGS. 6A and 6B illustrate a structure of the detection wiring according to various embodiments.
Figure 6B:
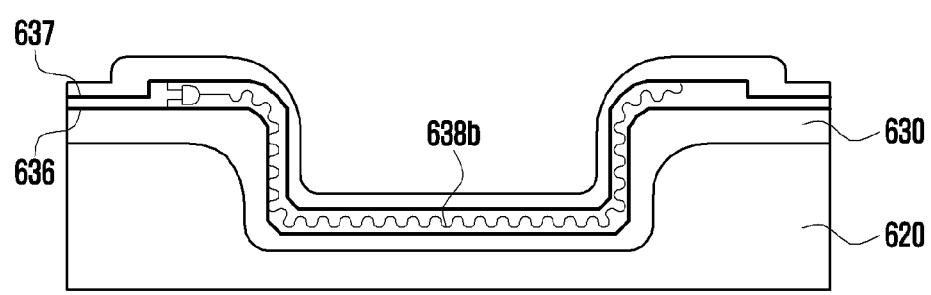

FIGS. 6A and 6B illustrate a structure of detection wiring according to various embodiments.

According to various embodiments, a wiring layer 630 (e.g., the wiring layer 530 of FIG. 5) may include detection wiring for detecting cracks of a pixel layer 620. The detection wiring (e.g., the detection wiring 430 of FIG. 4) may include a first detection line 636, a second detection line 637, and an opening detection line 638.

According to various embodiments, the first detection line 636 and the second detection line 637 may be disposed on the entire area of the display. For example, the first detection line 636 and the second detection line 637 may be disposed on an opening-adjacent area and all areas of left/right/upper/lower sides of the display, and detect cracks of the pixel layer 520 and/or a polymer layer 510. As illustrated, the first detection line 636 may be formed on an area more adjacent to the pixel layer 620 than the second detection line 637 on the wiring layer 630. In other words, the first detection line 636 may receive an impact caused by cracks adjacent to the pixel layer 620, and thereby an electrical property (e.g., impedance) is changed first, whereas the second detection line 637 may be subjected to a change in electrical property due to cracks adjacent to the polymer layer.

According to various embodiments, the first detection line 636 may include a first input end and a first output end to and from which an electrical signal of an inspection device (e.g., an inspection device outside the display or an electronic device including the display) is input and output. Further, the second detection line 637 may include a second input end and a second output end to and from which the electrical signal of the inspection device is input and output. The first output end and the second output end may be connected to the inspection device, and be directly connected to a detection circuit (e.g., the detection circuit 340 of FIG. 3).

According to various embodiments, the inspection device may input an input signal (e.g., a high or low signal) to the first input end of the first detection line 636 and the second input end of the second detection line 637, and detect whether or not cracks are formed on an inside (e.g., the pixel layer) on which the first detection line 636 is formed and/or an outside (e.g., the polymer layer) of the display on which the second detection line 637 formed, according to a logic value of an output signal output from the first output end and the second output end due to the input of the input signal. In the case where the input signal is different from the output signal, the inspection device may determine that the cracks are from on the first detection line 636 and/or the second detection line 637. For example, in the case where the inspection device inputs the high signal to the first input end, the high signal is output from the first output end with no change if no damage is caused to the first detection line 636, and the low signal may be output from the first output end according to a change in electrical property (e.g., impedance) of the first detection line 636 if damage is caused to the first detection line 636.

According to various embodiments, the detection wiring may include a logic circuit to which an input signal of the opening detection line 638 formed on the opening-adjacent area and an input signal of the inspection device are input, and which outputs output signals corresponding to logic values to the opening detection line 638. The opening detection line 638 may be disposed between the first detection line 636 and the second detection line 637. The input signals that are input to the first detection line 636 and the second detection line 637 by the inspection device may become input values of the logic circuit.

According to various embodiments, as illustrated in FIG. 6A, the opening detection line 638 may include a dot pattern line 638a. The dot pattern line 638a is for more accurately detecting formation of the cracks on the opening-adjacent area, and may be disposed on corner areas having a high possibility of the cracks being formed on the opening-adjacent area. According to another embodiment, as illustrated in FIG. 6B, the opening detection line 638 may include a curve pattern line 638b. The curve pattern line 638b may be formed in an "S" shape and cover a wide area between the first detection line 636 and the second detection line 637, and thus more accurate crack detection is possible.

According to various embodiments, an output end of the opening detection line 638 may be connected to the inspection device, and be directly connected to a detection circuit (e.g., the detection circuit 340 of FIG. 3). An input signal input to the opening detection line 638 may be an output signal of the logic circuit, and input signals of the logic circuit may be input signals that are input to the first detection line 636 and the second detection line 637 by the inspection device. Therefore, a logic value (e.g., High or Low) of the input signal of the opening detection line 638 may be determined according to the input signal output from the inspection device. According to various embodiments, according to whether the input signal output by the inspection device is the same as the output signal of the opening detection line 638, the inspection device may check whether or not the opening detection line 638 is damaged (or whether or not cracks are formed on the opening-adjacent area.

According to various embodiments, the inspection device (or the detection circuit) may check on which of the outside, inside, and opening area of the display the cracks are formed on the basis of the output signals of the first detection line 636, the second detection line 637, and the opening detection line 638.

Figure 7A:
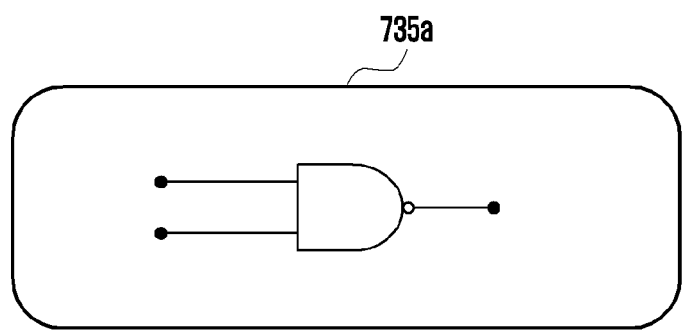
FIGS. 7A and 7B illustrate a crack detecting method according to a logic circuit and logic values of the detection wiring according to various embodiments.
Figure 7B:
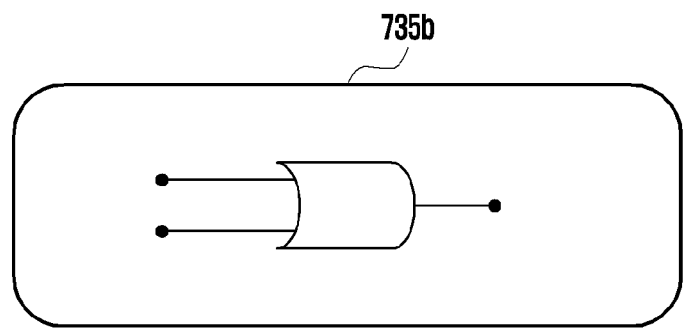

FIGS. 7A and 7B illustrate a crack detecting method according to a logic circuit of a detection wiring according to various embodiments and logic values.

According to various embodiments, a first detection wiring and a second detection wiring may be connected to an input stage of a logic circuit, and input signals output from an inspection device may be input to the input stage, and the inspection device or a detection circuit may be connected to an output stage of the logic circuit. The logic circuit may include a NAND gate (e.g., FIG. 7A) or an OR gate (e.g., FIG. 7B), but is not limited thereto.

FIG. 7A illustrates an example in which the logic circuit is formed as the NAND gate.

According to various embodiments, input signals having certain logic values may be input to the first input end of the first detection line and the second input end of the second detection line by the inspection device, and be input to the logic circuit. The inspection device may check on which of the outside, inside, and opening area of the display cracks are formed on the basis of output signals of the first output end of the first detection line (e.g., the first detection line 636 of FIG. 6A), the second output end of the second detection line (e.g., the second detection line 637 of FIG. 6A), and the output end of opening detection line (e.g., the opening detection line 638a of FIG. 6A). Each of the output signals may be input to the detection circuit, and thus the detection circuit may light at least some pixels of the display when the cracks are formed.

The inspection device may input a high signal to the first detection line and the second detection line in order to detect whether or not cracks are formed on an inner area (e.g., a pixel layer) and an outer area (e.g., a polymer layer) of an entire outline of the display. In this case, if the high signal is output from the first detection line, it may be identified that no damage is caused to the first detection line. If the low signal is output from the first detection line, it may be identified that damage is caused to the first detection line. Further, if the high signal is output from the second output end, it may be identified that no damage is caused to the second detection line. If the low signal is output from the second detection line, it may be identified that damage is caused to the second detection line. The signal output from the inspection device may be input to the logic circuit, and the logic circuit may output Low that is a High/High output value because the logic circuit is configured as the NAND gate. Accordingly, the opening detection line may be connected to the ground and be shielded.

According to various embodiments, the inspection device may input a high signal to the first detection line and input a low signal to the second detection line in order to detect whether or not cracks are formed on the outer area and an opening-adjacent area of the display. In this case, if the high signal is output from the first detection line, it may be identified that no damage is caused to the first detection line. If the low signal is output from the first detection line, it may be identified that damage is caused to the first detection line. Further, the logic circuit may output High that is a High/Low output value, and the high signal may be input to the opening detection line. If no damage is caused to the opening detection line, the output signal of the opening detection line may be a high signal. If damage is caused to the opening detection line, the output signal of the opening detection line may be a low signal.

According to various embodiments, the inspection device may input a high signal to the second detection line and input a low signal to the first detection line in order to detect whether or not cracks are formed on the inner area and the opening-adjacent area of the display. In this case, if the high signal is output from the second output stage, it may be identified that no damage is caused to the second detection line. If the low signal is output from the second output stage, it may be identified that damage is caused to the second detection line. Further, the logic circuit may output High that is a Low/High output value, and the high signal may be input to the opening detection line. If no damage is caused to the opening detection line, the output signal of the opening detection line may be a high signal. If damage is caused to the opening detection line, the output signal of the opening detection line may be a low signal.

According to various embodiments, the inspection device may input a low signal to both the first detection line and the second detection line in order to detect whether or not cracks are formed on the opening-adjacent area of the display. In this case, the low signal may be input to the first detection line and the second detection line, and the first detection line and the second detection line may be shielded. Because the output value of the logic circuit is High, it may be checked whether no not damage is caused to opening detection line.

As described above, the inspection device may use logical values of four combination as input signals, and identify an area where cracks are formed according to the output signals of the first detection line, the second detection line, and the opening detection line.

FIG. 7B illustrates an example in which a logic circuit is formed as an OR gate.

According to various embodiments, the inspection device may input a High/High signal to check whether the first detection line, the second detection line, and the opening detection line are damaged. In this case, the inspection device may check whether or not the first/second detection line is damaged according to the High/Low signal of the first/second output stage. In this embodiment, because the logic circuit is formed as the OR gate, the High/High output signal of the input signal may be a high signal. Accordingly, the high signal may be input to the opening detection line, and the inspection device may check whether or not cracks are formed on the opening-adjacent area according to the output signal of the opening detection line is the High/Low signal.

According to various embodiments, the inspection device may input the High/Low signal to identify damage to the first detection line and the opening detection line, and input the Low/High signal to identify damage to the second detection line and the opening detection line. For the purpose of shielding all the lines, the inspection device may input the Low/Low signal.

Figure 8:
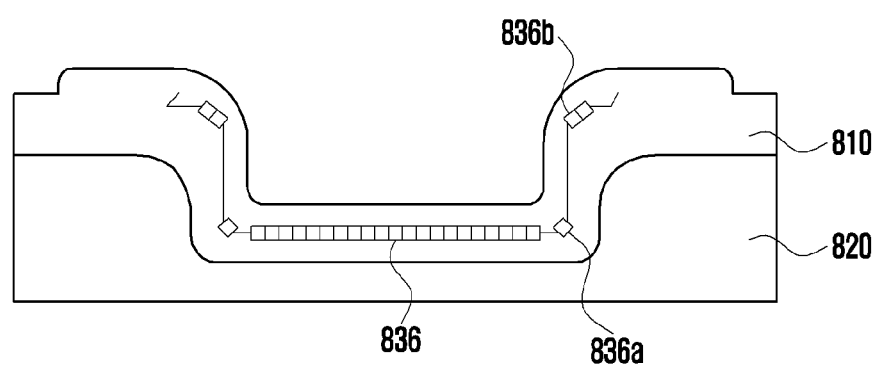
FIG. 8 illustrates a structure of detection wiring according to various embodiments.

FIG. 8 illustrates a structure of detection wiring according to various embodiments.

According to various embodiments, the detection wiring may include at least one dot pattern line 836 formed on the opening-adjacent area of the display. The inspection device may input a designated input signal to the dot pattern line 836, and detect whether or not the dot pattern line is damage according to an output signal of the dot pattern line 836 and cracks of a pixel layer 820 and/or a polymer layer 810 of the opening-adjacent area where the dot pattern line 836 is formed. According to various embodiments, an output end of the dot pattern line 836 may be directly connected to a detection circuit (e.g., the detection circuit 440 of FIG. 4). If cracks are formed on the opening-adjacent area, an output signal having a value different from that of an input signal may be output to the detection circuit according to a change in impedance caused by the cracks.

The detection wiring may include the dot pattern line 836, and thereby more accurately detect formation of cracks on specified areas (e.g., corner areas) having a high risk of the cracks being formed out of the opening-adjacent area. According to various embodiments, the detection wiring may include a plurality of dot pattern lines 836. The plurality of dot pattern lines 836 may be connected in series or parallel. In the case where the plurality of dot pattern lines 836 are connected in parallel, an electrical signal is output (or changed) according to a change in impedance of the dot pattern lines 836 disposed on an area where cracks are formed, and thus the inspection device may check accurate positions at which cracks are formed. In contrast, in the case where the plurality of dot pattern lines 836 are connected in series, it may be checked whether or not cracks are formed on the opening-adjacent area of the pixel layer 820.

According to various embodiments, the dot pattern lines 836 may be disposed adjacent to at least some (e.g., 836a and 836b) of the corner areas of the opening area. In the case of the corner areas, because there is a higher possibility of cracks being formed, the dot pattern lines 836 may be disposed to more accurately detect whether or not cracks are formed. However, the dot pattern lines 836 may be disposed on the corner areas as well as areas other than the opening area.

Figure 9:
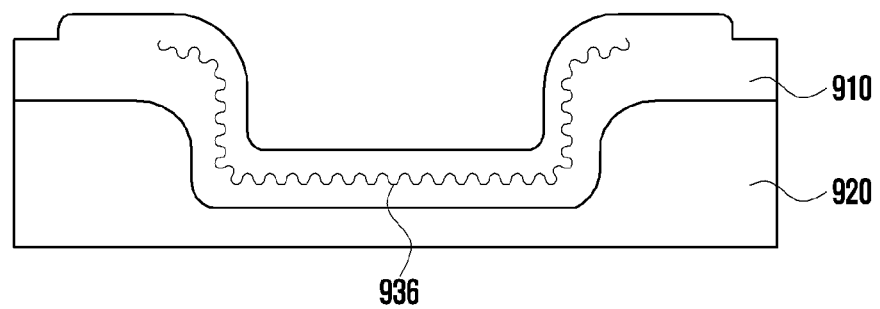
FIG. 9 illustrates a structure of detection wiring according to various embodiments.

FIG. 9 illustrates a structure of detection wiring according to various embodiments.

According to various embodiments, the detection wiring may include at least one curve pattern line 936 formed on the opening-adjacent area of the display. The inspection device may input a designated input signal to the curve pattern line 936, and detect whether the dot pattern line is damaged according to an output signal of the curve pattern line 936 and cracks of the pixel layer 820 and/or the polymer layer 810 of the opening-adjacent area formed on the curve pattern line 936.

According to various embodiments, an output end of the curve pattern line 936 may be directly connected to a detection circuit (e.g., the detection circuit 440 of FIG. 4). In the case where cracks are formed on an opening-adjacent area, the output signal having a different value from the input signal may be output to the detection circuit according to a change in impedance caused by the cracks.

The curve pattern line 936 may be formed in an "S" shape and cover a wide area on the opening-adjacent area, and thus more accurate crack detection is possible.

Figure 10:
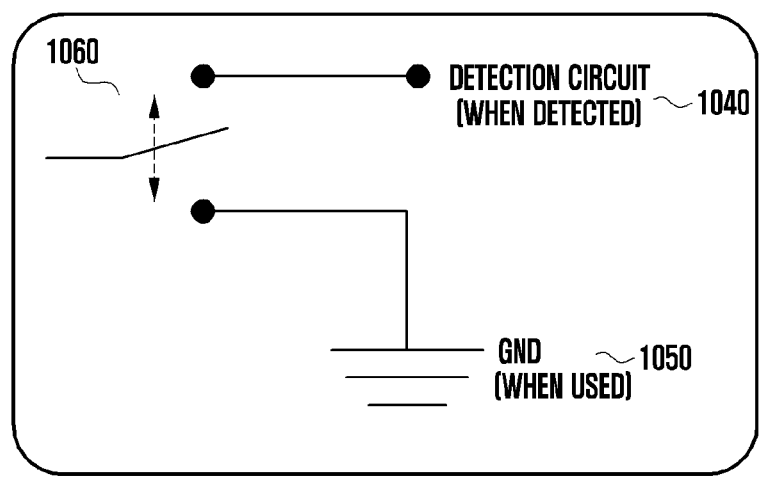
FIG. 10 illustrates a switch of a wiring layer according to various embodiments.

FIG. 10 illustrates a switch 1060 of a wiring layer according to various embodiments.

According to various embodiments, the wiring layer may include a switch 1060 that connects detection wiring to a detection circuit 1040 when a crack detecting function of a pixel layer is performed and connects the detection wiring to a ground 1050 if the crack detecting function of the pixel layer is completed. One end of the switch 1060 may be connected to the detection wiring, and the other end of the switch 1060 may be connected to the detection circuit 1040 or the ground 1050.

The switch 1060 may perform switching according to whether or not an external device is connected to a crack detection terminal connected to the detection wiring. For example, in the case where the external device is connected to the crack detection terminal and the crack detecting function is performed, the switch 1060 may perform switching such that the detection wiring is connected to the detection circuit 1040. In the case where cracks are formed at the pixel layer, the detection circuit 1040 may be made to light at least some pixels of the pixel layer according to a signal output from the detection wiring, and thereby it may be visually checked whether or not the cracks are formed at the pixel layer.

Further, in the case where the crack detecting function is completed, the switch 1060 may be made to enable the detection wiring to be connected to the ground 1050. The crack detecting function may be performed in a process of manufacturing the display device and/or a process of assembling the display device to the electronic device. In the case where a user actually uses the completed electronic device, the crack detecting function may not be performed. In this case, the detection wiring is connected to the ground 1050 to reduce noise between the display and the components such as a camera, a sensor etc. disposed on the opening area, and has a shielding effect.

A display device 300 according to various embodiments includes: a pixel layer 320 configured to include a plurality of pixels and have at least a partial area of an outline on which the plurality of pixels are disposed, the at least partial area of the outline being depressively formed; and a wiring layer 330 disposed along the depressively-formed at least partial area of the outline, and configured to include detection wiring 335 for detecting cracks on an area adjacent to the pixel layer 320, wherein the wiring layer 330 is disposed below the pixel layer 320.

According to various embodiments, the detection wiring 335 may include a first detection line and a second detection line, and the first detection line may be disposed more adjacent to the pixel layer 320 than the second detection line.

According to various embodiments, the display device 300 may further include a logic circuit configured to output an electrical signal to the detection wiring 335 on the basis of electrical signals input to the first detection line and the second detection line.

According to various embodiments, the electrical signals input to the first detection line and the second detection line may cope with a change in impedance of the first detection line and a change in impedance of the second detection line.

According to various embodiments, the detection wiring 335 may further include at least one dot pattern line that is disposed between the first detection line and the second detection line and is connected to at least one of the first detection line and the second detection line.

According to various embodiments, the at least one dot pattern line may be disposed adjacent to at least some of corner areas of the depressively-formed at least partial area.

According to various embodiments, the at least dot pattern lines may be connected in parallel.

According to various embodiments, the detection wiring 335 may further include a curve pattern line that is disposed between the first detection line and the second detection line and is connected to at least one of the first detection line and the second detection line.

According to various embodiments, the display device 330 may further include a detection circuit 340 that is connected to the detection wiring 335 and is set to perform lighting on the basis of an electrical signal input to the detection wiring 335.

According to various embodiments, the detection circuit 340 may be disposed on the depressively-formed at least partial area of the outline.

According to various embodiments, the detection circuit 340 may be set to emit light from at least a part of the pixel layer 320 connected to the detection circuit 340 on the basis of an electrical signal input from the detection wiring 335.

According to various embodiments, the wiring layer 330 may further include a switch for connecting the detection wiring 335 to the detection circuit 340 when a crack detecting function of the pixel layer 320 is performed and for connecting the detection wiring 335 to a ground when the crack detecting function of the pixel layer 320 is completed.

According to various embodiments, the detection wiring 335 may be connected to a detection terminal to which an external device is connectable, and the switch may be set to connect the detection wiring 335 to the detection circuit 340 if the external device is connected to the detection terminal.

Figure 11:
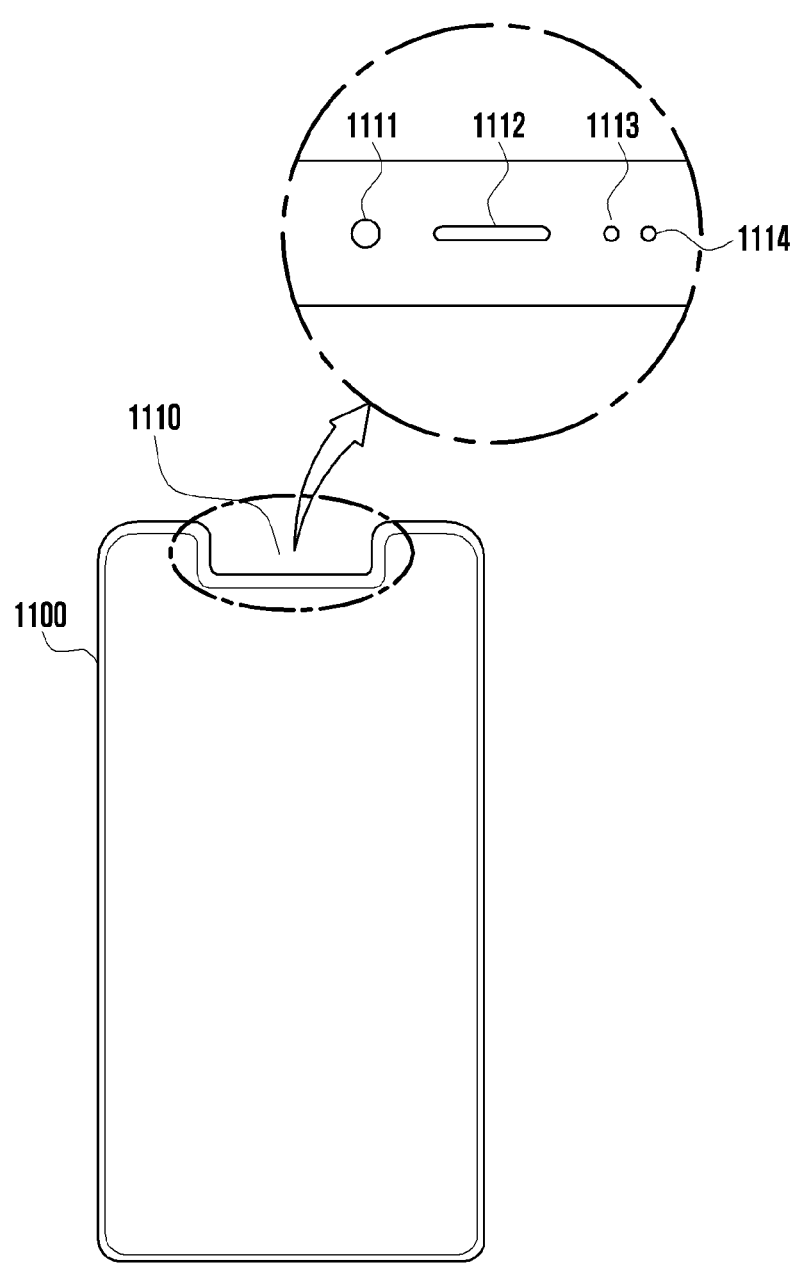
FIG. 11 illustrate a structure of an electronic device according to various embodiments.

FIG. 11 illustrates a structure of an electronic device 1100 according to various embodiments.

According to various embodiments, an electronic device 1100 (e.g., the electronic device 100) includes a display on a front surface thereof. The display may include at least some of the components of the display device described with reference to FIGS. 2 to 10.

According to various embodiments, a camera 1111, a receiver 1112, and various sensors such as an illuminace sensor 1113 and an iris sensor 1114 may be disposed on an opening area 1110 of the display of the electronic device 1100. In addition, various components suitable to be disposed on the front surface (e.g., the surface on which the display is disposed) of the electronic device 1100 may be disposed on the opening area 1110.

A detection wiring and a detection circuit of the display device may be intactly included in the electronic device 1100 as some components of the display device even if the display device is assembled to the electronic device 1100. In this case, when the electronic device 1100 is assembled and used actually, the detection wiring may be connected to a ground, and a crack detecting function may not be used.

The detection wiring may be electrically shielded according to the ground connection structure as described above. Accordingly, noise between the display and the other components (e.g., a camera, a receiver, a sensor, etc.) disposed on the opening area 1110 may be reduced.

An electronic device 1100 according to various embodiments includes: a display configure to include a pixel layer having at least a partial area of an outline on which a plurality of pixels are disposed and a wiring layer on which a detection wiring for detecting cracks on an area adjacent to the pixel layer is formed, the at least partial area of the outline being depressively formed; and at least one sensor disposed on the depressively-formed at least partial area, wherein the detection wiring is disposed along the depressively-formed at least partial area of the outline between the outline and the at least one sensor.

According to various embodiments, the detection wiring may include a first detection line and a second detection line, and the first detection line may be disposed more adjacent to the pixel layer than the second detection line.

According to various embodiments, the electronic device 1100 may further include at least one dot pattern line or a curve pattern line that is disposed between the first detection line and the second detection line and is connected to the first detection line and the second detection line.

According to various embodiments, the detection wiring may be connected to a ground.

According to various embodiments, the at least one sensor may include a camera, a photosensor, a fingerprint sensor, and a speaker.

Figure 12:
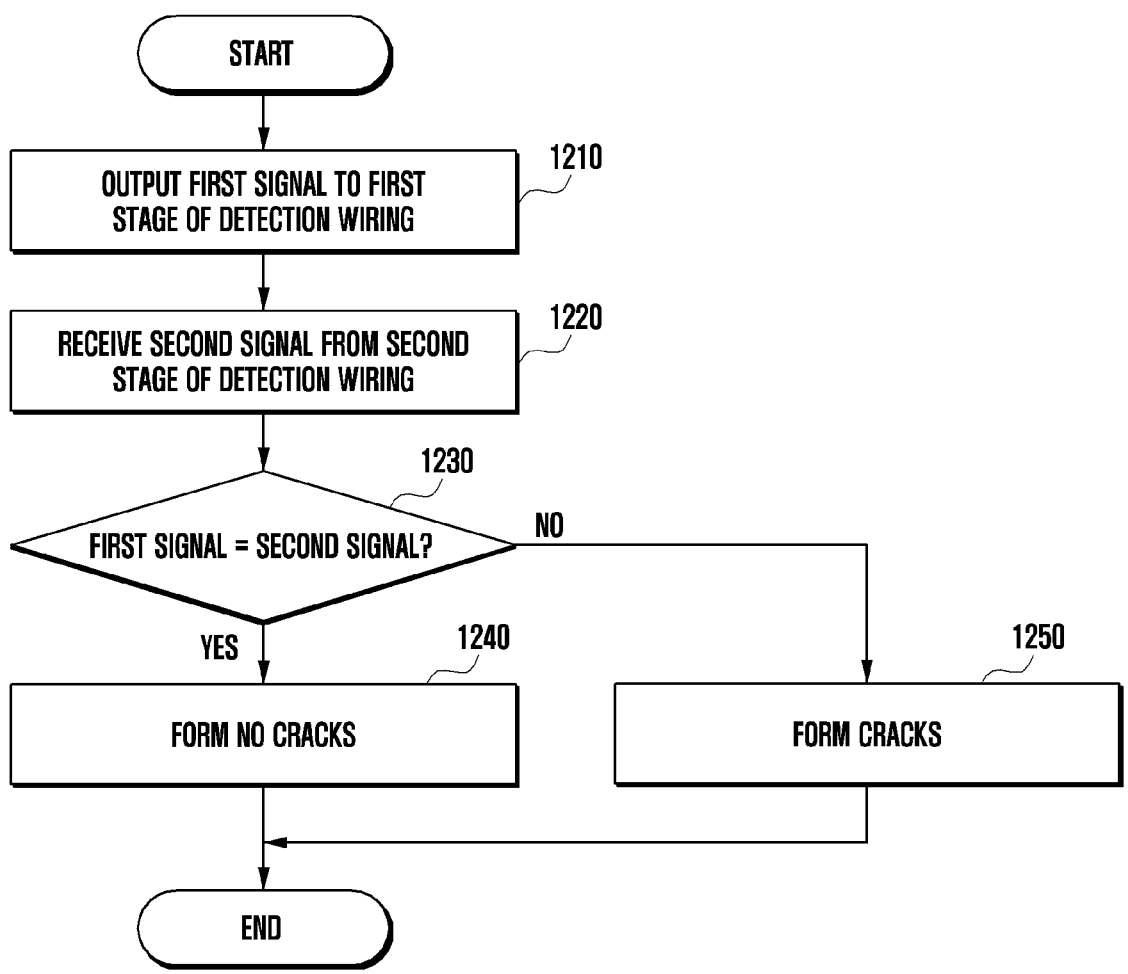
FIG. 12 is a flowchart illustrating a method of detecting cracks formed on an area adjacent to an opening formed in a display according to various embodiments.

FIG. 12 is a flow chart illustrating a method of detecting cracks formed on an area adjacent to an opening formed in a display according to various embodiments.

The illustrated method may be performed by an inspection device (e.g., an electronic device including a crack inspection device or a display device on a process) for detecting cracks formed on an area adjacent to an opening area (e.g., 225 of FIG. 2) of a display device (e.g., the display device 200 of FIG. 2).

In process 1210, the inspection device may output a first electrical signal to a first stage of detection wiring of the display device. According to various embodiments, the detection wiring may include a first detection line (e.g., the first detection line 636 of FIG. 6A), a second detection line (e.g., the second detection line 637 of FIG. 6A), and an opening detection line (e.g., the dot pattern line 638*a* of FIG. 6A or the curve pattern line 638*b* of FIG. 6B). According to various embodiments, the first electrical signal may include a logic signal of FIGS. 7A and 7B.

In process 1220, the inspection device may receive a second electrical signal that is input from a second stage of the detection wiring. According to various embodiments, the second electrical signal may include a signal that is output from each of the first detection line, the second detection line, and the opening detection line.

In process 1230, the inspection device may compare the first electrical signal with the second electrical signal. According to various embodiments, the inspection device may compare an input signal and an output signal of the first detection line, an input signal and an output signal of the second detection line, and an input signal and an output signal of the opening detection line.

As a result of the comparison of process 1230, if the first electrical signal is the same as the second electrical signal, the inspection device may identify that, in process 1240, no cracks are formed in the display device. According to various embodiments, the inspection device may check whether or not cracks are formed on each of the first detection line, the second detection line, and the opening detection line on the basis of the input signal and the output signal of each line.

As a result of the comparison of process 1230, if the first electrical signal is not the same as the second electrical signal, the inspection device may identify that, in process 1250, cracks are formed in the display device. According to various embodiments, as described in FIGS. 6A, 6B, 7A, and 7B, the inspection device may indentify an area on which cracks are formed according to the output signal of each of the first detection line, the second detection line, and the opening detection line.

A device for detecting cracks of at least a part of a display device according to various embodiments includes: an output circuit for outputting a first electrical signal to a first stage of detection wiring of the display device; an input circuit for receiving a second electrical signal input from a second stage of the detection wiring; and a processor that is operatively connected to the output circuit and the input circuit, wherein the processor is set to output the first electrical signal to the detection wiring using the output circuit, to receive the second electrical signal using the input circuit, and to detect the cracks on an area adjacent to a pixel layer of the display device on the basis of the first electrical signal and the second electrical signal.

According to various embodiments, if the cracks are detected, the processor may be set to output a third electrical signal to a detection circuit of the display device.

What is claimed is:

1. A display device comprising:
a pixel layer having a notch therein and including a plurality of pixels; and
a wiring layer disposed below the pixel layer, the wiring layer including detection wiring disposed between an edge of the pixel layer and an outline of the notch, wherein the detection wiring is disposed along the notch and the detection wiring is for detecting cracks on an area adjacent to the pixel layer,
wherein the detection wiring includes a first detection line and a second detection line, and the first detection line is disposed more adjacent to the pixel layer than the second detection line.

2. The display device of claim 1, further comprising a logic circuit configured to output an electrical signal based on electrical signals input to the first detection line and the second detection line.

3. The display device of claim 2, wherein the electrical signals input to the first detection line and the second detection line allow detection of a change in impedance of the first detection line and a change in impedance of the second detection line.

4. The display device of claim 1, wherein the detection wiring further includes at least one dot pattern line disposed between the first detection line and the second detection line and connected to at least one of the first detection line and the second detection line.

5. The display device of claim 4, wherein the at least one dot pattern line is disposed adjacent to at least some corner areas of the notch.

6. The display device of claim 5, wherein the at least one dot pattern line is connected in parallel.

7. The display device of claim 1, wherein the detection wiring further includes a curved pattern line disposed between the first detection line and the second detection line and connected to at least one of the first detection line and the second detection line.

8. The display device of claim 1, further comprising a detection circuit connected to the detection wiring and configured to perform lighting based on an electrical signal input to the detection wiring.

9. The display device of claim 8, wherein the detection circuit is disposed in the notch.

10. The display device of claim 8, wherein the detection circuit is configured to emit light from at least a part of the pixel layer connected to the detection circuit based on an electrical signal input from the detection wiring.

11. The display device of claim 8, wherein the wiring layer further includes a switch for connecting the detection wiring to the detection circuit for pixel layer crack detection and for connecting the detection wiring to a ground when the pixel layer crack detection is completed.

12. The display device of claim 11, wherein:
the detection wiring is connected to a detection terminal to which an external device is connectable; and
the switch is configured to connect the detection wiring to the detection circuit based on the external device being connected to the detection terminal.

13. An electronic device comprising:
a display comprising a pixel layer having a notch therein and including a plurality of pixels, and a wiring layer including detection wiring disposed between an edge of the pixel layer and an outline of the notch, wherein the detection wiring is disposed along the notch and the detection wiring is for detecting cracks on an area adjacent to the pixel layer; and
at least one sensor disposed in the notch of the pixel layer, wherein the detection wiring is disposed between the pixel layer and the at least one sensor,
wherein the detection wiring includes a first detection line and a second detection line, and the first detection line is disposed more adjacent to the pixel layer than the second detection line.

14. The electronic device of claim 13, further comprising at least one dot pattern line or a curved pattern line disposed between the first detection line and the second detection line and connected to the first detection line and the second detection line.

15. The electronic device of claim 13, wherein the detection wiring is connected to a ground.

16. The electronic device of claim 13, wherein the at least one sensor includes at least one of a camera, a photosensor, a fingerprint sensor, or a speaker.

17. A device for detecting cracks of at least a part of a display device, comprising:
an output circuit configured to output a first electrical signal to a first stage of detection wiring of the display device;
an input circuit configured to receive a second electrical signal input from a second stage of the detection wiring; and
a processor operatively connected to the output circuit and the input circuit,
wherein the processor is configured to:
output the first electrical signal to the detection wiring using the output circuit;
receive the second electrical signal using the input circuit; and
detect cracks on an area adjacent to at least a notch of a pixel layer of the display device based on the first electrical signal and the second electrical signal,
wherein the detecting wiring is disposed between an edge of the pixel layer and an outline of the notch, wherein the detection wiring is disposed along the notch and the detection wiring is for detecting cracks on an area adjacent to the pixel layer, and wherein the detection wiring includes a first detection line and a second detection line, and the first detection line is disposed more adjacent to the pixel layer than the second detection line.

18. The device for detecting cracks of claim 17, wherein the processor is configured to, based on cracks being detected, output a third electrical signal to a detection circuit of the display device.

* * * * *